(12) United States Patent
Zhou et al.

(10) Patent No.: US 12,532,564 B2
(45) Date of Patent: Jan. 20, 2026

(54) N-TYPE MONOCRYSTALLINE SILICON DOUBLE-SIDED SOLAR CELL AND PREPARATION METHOD THEREOF

(71) Applicant: Tongwei Solar (Meishan) Co., Ltd., Sichuan (CN)

(72) Inventors: Gongqing Zhou, Sichuan (CN); Kun Hou, Sichuan (CN); Shixiang Tan, Sichuan (CN); Taosheng Yuan, Sichuan (CN)

(73) Assignee: Tongwei Solar (Meishan) Co., Ltd., Sichuan (CN)

( * ) Notice: Subject to any disclaimer, the term of this patent is extended or adjusted under 35 U.S.C. 154(b) by 122 days.

(21) Appl. No.: 18/007,408

(22) PCT Filed: Jun. 29, 2022

(86) PCT No.: PCT/CN2022/102387
§ 371 (c)(1),
(2) Date: Jan. 30, 2023

(87) PCT Pub. No.: WO2023/065715
PCT Pub. Date: Apr. 27, 2023

(65) Prior Publication Data
US 2024/0274744 A1    Aug. 15, 2024

(30) Foreign Application Priority Data
Oct. 19, 2021   (CN) .......................... 202111224537.2

(51) Int. Cl.
*H10F 71/00*    (2025.01)
*H10F 10/14*    (2025.01)

(52) U.S. Cl.
CPC ......... *H10F 71/121* (2025.01); *H10F 10/148* (2025.01)

(58) Field of Classification Search
None
See application file for complete search history.

(56) References Cited

U.S. PATENT DOCUMENTS

| | | | | |
|---|---|---|---|---|
| 6,127,623 A | * | 10/2000 | Nakamura | H10F 77/703 257/E31.13 |
| 2012/0181667 A1 | * | 7/2012 | Geerligs | H01L 31/18 257/E31.13 |

(Continued)

FOREIGN PATENT DOCUMENTS

| | | |
|---|---|---|
| CN | 102403399 A | 4/2012 |
| CN | 105047742 A | 11/2015 |

(Continued)

OTHER PUBLICATIONS

Machine translation of CN105826411A (Year: 2016).*

(Continued)

*Primary Examiner* — Ryan S Cannon
(74) *Attorney, Agent, or Firm* — Ziegler IP Law Group, LLC.

(57) ABSTRACT

Provided are N-type monocrystalline silicon double-sided solar cell and preparation method thereof. Preparation method includes following steps: S1: performing double-sided texturing to obtain N-type monocrystalline silicon with front surface and back surface having first textured structures respectively; S2: performing back-surface phosphorus diffusion doping to form back surface field; S3: removing winding plating and PSG on front surface and back surface, forming mask for protecting first textured structure of back surface on surface of back surface field, and manufacturing second textured structure on front surface of N-type monocrystalline silicon; S4: performing front-surface boron diffusion doping to form front-surface doped emitter junction layer; S5: after removal of mask, winding plating and BSG on front surface and back surface, (Continued)

depositing passivation antireflection layer on surface of front-surface doped emitter junction layer, and depositing passivation layer on surface of back surface field; and S6: preparing front surface electrode and back surface electrode.

16 Claims, 2 Drawing Sheets

(56) References Cited

U.S. PATENT DOCUMENTS

| | | | | |
|---|---|---|---|---|
| 2012/0222734 | A1* | 9/2012 | Kano | H01L 31/0684 |
| | | | | 136/255 |
| 2022/0059718 | A1* | 2/2022 | Yuan | H01L 31/02167 |

FOREIGN PATENT DOCUMENTS

| CN | 105826411 | A | * | 8/2016 | |
| --- | --- | --- | --- | --- | --- |
| CN | 106653942 | A | | 5/2017 | |
| CN | 107863417 | A | | 3/2018 | |
| CN | 111628047 | A | * | 9/2020 | H01L 31/022425 |
| CN | 111628049 | A | | 9/2020 | |
| CN | 113964241 | A | | 1/2022 | |
| CN | 114141906 | A | * | 3/2022 | H10F 71/00 |
| KR | 20150007394 | A | | 1/2015 | |

OTHER PUBLICATIONS

Machine translation of CN111628047A (Year: 2020).*
Machine translation of CN114141906A (Year: 2022).*
Australian Government IP Australia, Examination report No. 1, Application No. 2022291551, mailed Nov. 17, 2023, 4 pages.
Australian Government IP Australia, Examination report No. 2, Application No. 2022291551, mailed May 14, 2024, 5 pages.
Australian Government IP Australia, Examination report No. 3, Application No. 2022291551, mailed Sep. 4, 2024, 4 pages.
European Patent Office, Communication pursuant to Article 94(3) EPC, Application No. 22826641.7, mailed Jan. 3, 2024, 2 pages.
European Patent Office, Supplementary European Search Report, Application No. 22826641, dated Dec. 1, 2023, 2 pages.
International Search Report, China Patent Office, Application No. PCT/CN2022/102387, mailed Aug. 29, 2022, 4 pages.
International Written Opinion, China Patent Office, Application No. PCT/CN2022/102387, mailed Aug. 29, 2022, 7 pages.

* cited by examiner

N-TYPE MONOCRYSTALLINE SILICON DOUBLE-SIDED SOLAR CELL AND PREPARATION METHOD THEREOF

CROSS-REFERENCE TO RELATED APPLICATIONS

The present disclosure claims priority to Chinese Patent Application No. 202111224537.2, entitled "N-type Monocrystalline Silicon Double-Sided Solar Cell and Preparation Method Thereof", filed with China National Intellectual Property Administration on Oct. 19, 2021, the entire content of which is incorporated herein by reference.

TECHNICAL FIELD

The aspects of the disclosed embodiments relate to the field of solar cells, and particularly to an N-type monocrystalline silicon double-sided solar cell and a preparation method thereof.

BACKGROUND ART

Currently, most of crystalline silicon solar cells in the market are P-type monocrystalline/polycrystalline conventional aluminum back surface field cells, and a preparation process thereof is relatively simple and has a low cost. However, a photoelectric conversion efficiency of the P-type silicon cell cannot reach more than 23.5%, and a light attenuation phenomenon generated by the cell with a P-type silicon wafer as a substrate cannot be completely solved, such that these factors become obstacles for further mass production and popularization. Compared with P-type silicon, N-type silicon has longer minority carrier lifetime and higher tolerance to metal, such as Fe, or the like, and is not prone to generate light induced degradation (LID) caused by a B-O complex; a cell slice with the N-type silicon as a substrate has a higher conversion efficiency, and can relatively reduce a manufacturing cost of photovoltaic power generation, such that the N-type silicon becomes a necessary material of a high-efficiency crystalline silicon solar cell.

However, the existing N-type high-efficiency cell generally requires complex processes, such as plural times of high-temperature diffusion, oxidation masking, junction-removing etching, or the like, which has a low preparation efficiency and a high cost, and meanwhile has a problem of parallel failure caused by incomplete etching.

SUMMARY

The present disclosure provides an N-type monocrystalline silicon double-sided solar cell and a preparation method thereof, which can solve at least one of the above technical problems.

Some examples of the present disclosure provide a preparation method of an N-type monocrystalline silicon double-sided solar cell, which may include the following steps:
- S1: performing double-sided texturing to obtain N-type monocrystalline silicon with a front surface and a back surface having first textured structures respectively;
- S2: performing back-surface phosphorus diffusion doping to form a back surface field;
- S3: removing winding plating and PSG on the front surface and the back surface, forming a mask for protecting the first textured structure of the back surface on a surface of the back surface field, and manufacturing a second textured structure on the front surface of the N-type monocrystalline silicon, wherein the second textured structure has a pyramid-shaped textured morphology;
- S4: performing front-surface boron diffusion doping to form a front-surface doped emitter junction layer;
- S5: after removal of the mask as well as the winding plating and the BSG on the front surface and the back surface, depositing a passivation antireflection layer on a surface of the front-surface doped emitter junction layer, and depositing a passivation layer on the surface of the back surface field; and
- S6: preparing a front surface electrode and a back surface electrode.

In the preparation method, a new process route of firstly processing the back surface and then processing the front surface is adopted for processing, thus simplifying manufacturing steps; the first textured structure on the back surface is protected by providing the mask, thus preventing the first textured structure on the back surface from being influenced while the second textured structure is prepared on the front surface. Meanwhile, the mask is removed in step S5, such that the boron doping in step S4 cannot be rounded and extend to the back surface due to existence of the mask, and then, the mask on the back surface is removed during BSG removal in step S5; compared with a conventional etching method, not only working procedures are saved, but also an acid polishing or alkali polishing etching working procedure is removed, which can effectively reduce a production cost, reduce high nitrogen emission, and avoid a problem of parallel failure caused by incomplete etching, thereby improving a quantum conversion efficiency of the both surfaces of the N-type monocrystalline silicon double-sided solar cell and improving a contact performance.

The first textured structure on the back surface can ensure that the back surface has certain roughness, and can be in better contact with the back surface electrode, and meanwhile, the first textured structure can be set according to actual requirements, such that reflectivity of the back surface can be reduced to improve a quantum conversion efficiency of the back surface of the N-type monocrystalline silicon double-sided solar cell.

In some embodiments, in step S1, the first textured structure may have a platform-shaped textured morphology, the first textured structure includes a plurality of platform structures arranged in an array, each platform structure has a lower plane connected to the N-type monocrystalline silicon and an upper plane opposite to the lower plane, and a size of the lower plane is greater than that of the upper plane;

optionally, in step S1, the step of performing double-sided texturing may include: firstly performing alkali texturing using a strong alkali aqueous solution to obtain N-type monocrystalline silicon with a front surface and a back surface having a pyramid textured morphology respectively, and then performing acid texturing on the N-type monocrystalline silicon with the front surface and the back surface having the pyramid textured morphology respectively, so as to obtain the N-type monocrystalline silicon with the front surface and the back surface having the first textured structures respectively.

In some embodiments, the step of performing acid texturing may include: soaking in an acid solution consisting of a hydrofluoric acid aqueous solution and a nitric acid aqueous solution having a volume ratio of 0.9-1.1:0.9-1.1, and performing texturing for 20-100 s at 8-15° C., the hydrofluoric acid aqueous solution having a mass concentration of 20-40% and the nitric acid aqueous solution having a mass concentration of 20-40%.

In some embodiments, the step of performing alkali texturing may include: soaking in a strong alkali aqueous solution with a mass concentration of 1.5-3%, and performing texturing for 50-200 s at 65-75° C.

In some embodiments, in step S5, the step of manufacturing a second textured structure on the front surface of the N-type monocrystalline silicon may include: soaking in a strong alkali aqueous solution with a volume concentration of 1.5-3%, performing texturing for 50-200 s at 65-75° C., and cleaning the surface using a hydrofluoric acid aqueous solution and a hydrochloric acid aqueous solution sequentially.

In some embodiments, a material of the mask includes silicon nitride, and the mask has a thickness of 15-25 nm.

In some embodiments, step S5 may include: cleaning using a hydrofluoric acid aqueous solution to remove the mask as well as the winding plating and the BSG on the front surface and the back surface.

In some embodiments, step S3 may include: cleaning using a hydrofluoric acid aqueous solution to remove the winding plating and the PSG on the front surface and the back surface.

In some embodiments, after the back-surface phosphorus diffusion doping is performed to form the back surface field, step S2 may further include: performing, using laser, local heavy doping on a position of the back surface of the N-type monocrystalline silicon to be provided with the back surface electrode.

In some embodiments, a height of the platform structure may be 0.3-0.5 μm, a width of the lower surface of the platform structure may be 10-15 μm, and reflectivity of the platform-shaped textured morphology may be 25-35%.

In some embodiments, the back-surface phosphorus diffusion doping may be performed using a low-pressure diffusion process to form a shallow junction with a high surface concentration, and the low-pressure diffusion process may have low-pressure diffusion pressure of 50-100 mPa, a phosphorus-source flow rate of 800-1200 sccm, a post-oxidation time of 3-8 min, and a junction push temperature of 840-860° C.

In some embodiments, in step S3, the step of manufacturing a second textured structure on the front surface of the N-type monocrystalline silicon includes: soaking in a strong alkali aqueous solution with a volume concentration of 1.5-3%, performing texturing for 50-200 s at 65-75° C., and cleaning the surface using a hydrofluoric acid aqueous solution and a hydrochloric acid aqueous solution sequentially.

In some embodiments, the step of depositing a passivation antireflection layer on a surface of the front-surface doped emitter junction layer may include: depositing an aluminum oxide layer and a front-surface silicon nitride layer on the surface of the front-surface doped emitter junction layer in sequence, a thickness of the aluminum oxide layer being 1-3 nm, and a thickness of the silicon nitride layer being 75-82 nm.

In some embodiments, the step of depositing a passivation antireflection layer on the surface of the back surface field may include: depositing a back-surface silicon nitride layer on the surface of the back surface field, the back-surface silicon nitride layer 14 having a film thickness of 80-85 nm.

Some other examples of the present disclosure provide an N-type monocrystalline silicon double-sided solar cell prepared using the above preparation method, wherein a first textured structure has a platform-shaped textured morphology, the first textured structure includes a plurality of platform structures arranged in an array, a height of the platform structure is 0.3-0.5 μm, each platform structure has a lower plane connected with N-type monocrystalline silicon and an upper plane opposite to the lower plane, a size of the lower plane is greater than that of the upper plane, a width of the lower surface of the platform structure is 10-15 μm, and reflectivity of the first textured structure is 25-35%.

The N-type monocrystalline silicon double-sided solar cell avoids the problem of parallel failure caused by incomplete etching due to the preparation process, and meanwhile, the first textured structure on the back surface obviously improves a quantum conversion efficiency of the back surface, and then improves a quantum conversion rate of the both surfaces of the N-type monocrystalline silicon double-sided solar cell.

BRIEF DESCRIPTION OF DRAWINGS

To describe the technical solutions in the embodiments of the present disclosure more clearly, the following briefly describes the accompanying drawings required in the embodiments. It should be understood that the following accompanying drawings show merely some embodiments of the present disclosure and therefore should not be considered as limiting the scope, and a person of ordinary skill in the art may still derive other related drawings from these accompanying drawings without creative efforts.

Reference numerals: 10—N-type monocrystalline silicon; 11—back surface field; 12—local heavily doped region; 13—mask; 14—back-surface silicon nitride layer; 15—back surface electrode; 21—front-surface doped emitter junction layer; 22—aluminum oxide layer; 23—front-surface silicon nitride layer; 24—front surface electrode.

DETAILED DESCRIPTION OF EMBODIMENTS

The implementation of the present disclosure will be described in detail below in conjunction with embodiments, but those skilled in the art would understand that the following embodiments are merely for illustrating the present disclosure and should not be deemed as restriction of the present disclosure. The embodiments in which specific conditions are not given are performed according to conventional conditions or conditions suggested by manufacturers. The reagents or instruments used in the present disclosure, the manufacturers of which are not indicated, are the commercially available conventional products.

An N-type monocrystalline silicon double-sided solar cell and a preparation method thereof according to embodiments of the present disclosure are described specifically below.

Figure 1:
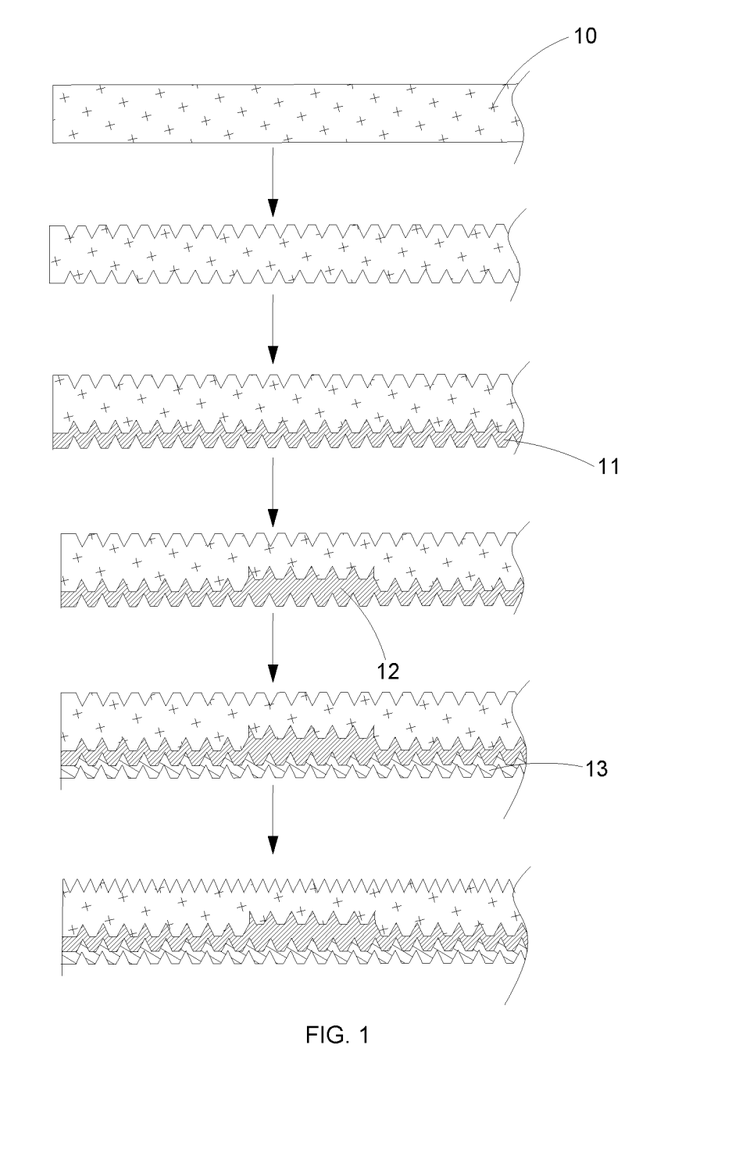
FIG. 1 is a flow chart of preparation of steps S1 to S3.
Figure 2:
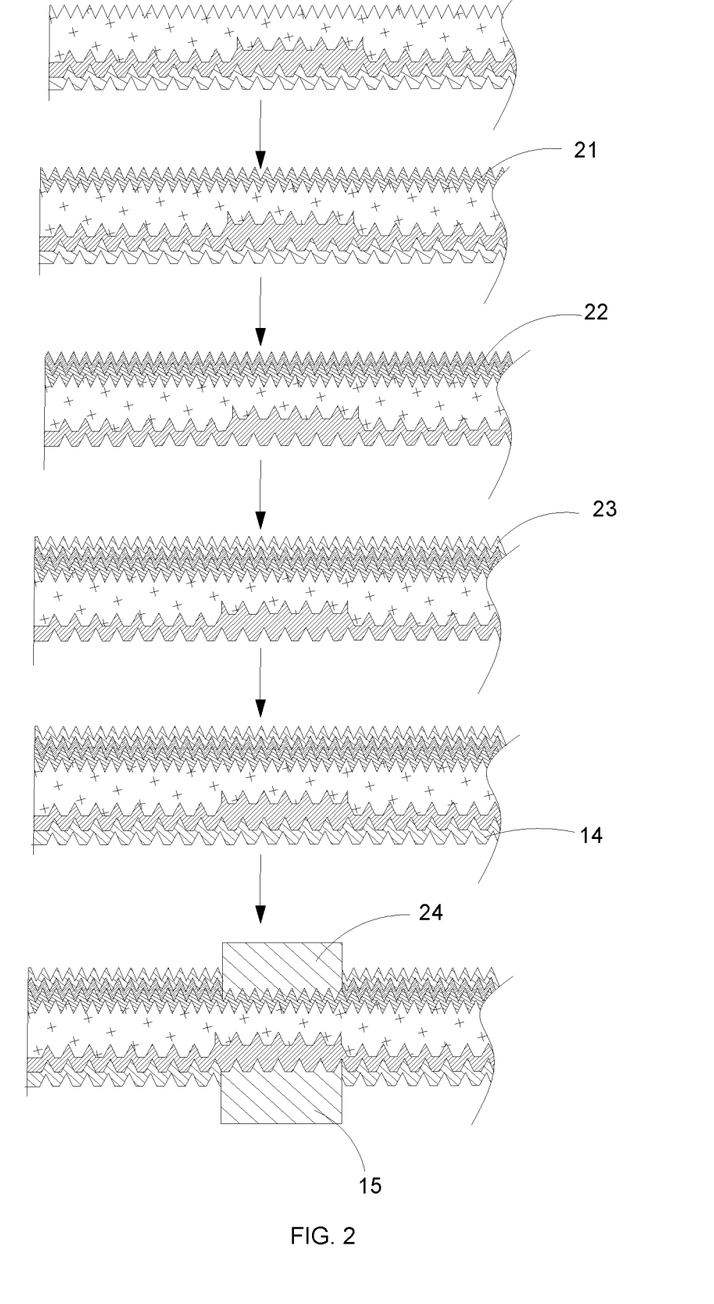
FIG. 2 is a flow chart of preparation of steps S3 to S6.

Referring to FIGS. 1 and 2, disclosed is a preparation method of an N-type monocrystalline silicon double-sided solar cell, including the following steps:

S1: performing double-sided texturing to obtain N-type monocrystalline silicon 10 with a front surface and a back surface having first textured structures respectively.

Referring to FIG. 1, the first textured structure has a platform-shaped textured morphology, and includes a plurality of platform structures arranged in an array, each platform structure has a lower plane connected to the N-type monocrystalline silicon 10 and an upper plane opposite to the lower plane, and a size of the lower plane is greater than that of the upper plane.

Optionally, a height of the platform structure is 0.3-0.5 μm, a width of the lower surface of the platform structure is 10-15 μm, and reflectivity of the platform-shaped textured morphology is 25-35%.

In step S1, the step of performing double-sided texturing includes: firstly performing alkali texturing using a strong alkali aqueous solution to obtain N-type monocrystalline silicon 10 with a front surface and a back surface having a pyramid textured morphology respectively, and then performing acid texturing on the N-type monocrystalline silicon 10 with the front surface and the back surface having the pyramid textured morphology respectively, so as to obtain the N-type monocrystalline silicon 10 with the front surface and the back surface having platform-shaped textured morphology (i.e., the first textured structures) respectively.

In the above steps, firstly, alkali texturing is adopted to form the pyramid textured morphology, and then, a top end of the pyramid textured morphology is chemically corroded by acid to form the platform-shaped textured morphology; the preparation process is simple and controllable, and the platform-shaped textured morphology may reduce reflectivity of the back surface, and can also ensure that the back surface has certain roughness and can be in better contact with a back surface electrode 15, thus improving a quantum conversion efficiency of the back surface of the N-type monocrystalline silicon double-sided solar cell.

Optionally, the step of performing alkali texturing includes: soaking in a strong alkali aqueous solution containing a texturing additive and having a strong alkali mass concentration of 1.5-3%, and performing texturing at 65-75° C. for 50-200 s, such as 50 s, 70 s, 100 s, 130 s, 150 s, 180 s, 200 s, or the like. The strong alkali aqueous solution here is, for example, a NaOH solution or KOH solution. The texturing additive is used for controlling a size and a height of a grown pyramid, is a conventional texturing additive which can be directly purchased in the market, and is not limited herein.

Optionally, the step of performing acid texturing includes: soaking in an acid solution consisting of a hydrofluoric acid aqueous solution and a nitric acid aqueous solution with a volume ratio of 0.9-1.1:0.9-1.1, such as 0.9:1, 0.9:1.1, 1:1, 1.1:0.9, or the like, and performing texturing at 8-15° C. for 20-100 s, such as 20 s, 30 s, 50 s, 70 s, 80 s, 100 s, or the like, a mass concentration of the hydrofluoric acid aqueous solution being 20-40% and a mass concentration of the nitric acid aqueous solution being 20-40%.

By the specific ratio, the top end of the pyramid textured morphology can be flattened to form the platform-shaped textured morphology.

It should be noted that, in the double-sided texturing process, uniformity and a size of the platform structure are seriously affected by non-uniformity of a temperature and a concentration, and therefore, optionally, the double-sided texturing and front-surface texturing in subsequent step S3 in the embodiment of the present disclosure are both performed using a texturing tank shown in CN201910331455.4, and since the texturing tank performs accurate temperature control on silicon wafer pickling, the concentration and temperature of the solution in the whole tank can be maximally balanced by a special arc-shaped tank bottom in conjunction with a stirring device by means of mechanical stirring and nitrogen bubble stirring, such that a reaction speed of a textured surface can be controlled to obtain the back surface and the platform-shaped textured structure on the back surface.

Optionally, a size of the N-type monocrystalline silicon 10 is greater than or equal to 180 mm; that is, the above device and the above preparation manner are suitable for large monocrystalline silicon, such as the N-type monocrystalline silicon 10 with the size greater than or equal to 180 mm, thus guaranteeing a uniform arrangement of the platform structures in the obtained platform-shaped textured structure.

S2: performing back-surface phosphorus diffusion doping to form a back surface field 11.

The back-surface phosphorus diffusion doping may be performed using a low-pressure diffusion process to form a shallow junction with a high surface concentration.

The low-pressure diffusion process has low-pressure diffusion pressure of 50-100 mPa, a phosphorus-source flow rate of 800-1200 sccm, a post-oxidation time of 3-8 min, and a junction push temperature of 840-860° C. With the two-step deposition process, the back surface field 11 and PSG (phosphosilicate glass) are sequentially generated on the back surface of the N-type monocrystalline silicon 10 finally, and sheet resistance of the N-type monocrystalline silicon 10 obtained after phosphorus diffusion is 150-170Ω.

In some optional examples, after the back-surface phosphorus diffusion doping is performed to form the back surface field 11, step S2 further includes: performing, using laser, local heavy doping on a position of the back surface of the N-type monocrystalline silicon 10 to be provided with the back surface electrode 15, so as to obtain a local heavily doped region 12, and then, a purpose of selective phosphorus diffusion is achieved, thereby improving a back-surface collection rate, improving a sintering performance of the back surface electrode 15, and meanwhile allowing the PSG on a surface layer to become loose and thin, which facilitates subsequent removal.

S3: referring to FIGS. 1 and 2, removing winding plating and PSG on the front surface and the back surface, forming a mask 13 for protecting the platform-shaped textured structure of the back surface on a surface of the back surface field 11, and manufacturing a second textured structure on the front surface of the N-type monocrystalline silicon 10, wherein the second textured structure has a pyramid-shaped textured morphology.

The N-type monocrystalline silicon 10 obtained in step S2 may be cleaned with a hydrofluoric acid aqueous solution, and then, the winding plating and PSG on the front surface and the back surface may be removed with HF. The hydrofluoric acid aqueous solution used here has a mass concentration of 5-50%, optionally 20-40%.

Optionally, the step of manufacturing a second textured structure on the front surface of the N-type monocrystalline silicon includes: soaking in a strong alkali aqueous solution with a volume concentration of 1.5-3%, performing texturing for 50-200 s at 65-75° C., and cleaning the surface using a hydrofluoric acid aqueous solution and a hydrochloric acid aqueous solution sequentially.

That is, the platform-shaped textured morphology is changed into the pyramid-shaped textured morphology by means of alkali texturing.

Optionally, a material of the mask 13 includes silicon nitride which does not react with a strong alkali solution for subsequently preparing the pyramid-shaped textured morphology, thus effectively protecting the platform-shaped textured morphology on the back surface and preventing a depth of the back surface field from being significantly increased in step S4.

The mask 13 may be made using plate-type PECVD.

Optionally, a thickness of the mask 13 is 15-25 nm, such as 15 nm, 17 nm, 19 nm, 20 nm, 22 nm, 24 nm, 25 nm, or the like.

That is, the platform-shaped textured morphology on the back surface is protected by arranging the mask 13, so as to prevent the platform-shaped textured morphology on the back surface from being influenced while the pyramid-shaped textured morphology is prepared on the front surface. Meanwhile, the mask 13 is removed in step S5, such that boron doping in step S4 cannot be rounded and extend to the back surface due to existence of the mask 13, and then, the mask 13 on the back surface is removed during BSG removal in step S5; compared with a conventional etching method, not only working procedures are saved, but also a problem of parallel failure caused by incomplete etching is avoided, thereby improving a quantum conversion efficiency of the both surfaces of the N-type monocrystalline silicon double-sided solar cell and improving a contact performance.

S4: performing front-surface boron diffusion doping to form a front-surface doped emitter junction layer 21.

Boron diffusion doping is performed on the front surface to produce the front-surface doped emitter junction layer 21, and meanwhile, the BSG is produced.

S5: after removal of the mask 13 as well as the winding plating and the BSG on the front surface and the back surface, depositing a passivation antireflection layer on a surface of the front-surface doped emitter junction layer 21, and depositing a passivation layer on the surface of the back surface field The step of removing the winding plating and the BSG on the front surface and the back surface and the mask 13 includes: cleaning using a hydrofluoric acid aqueous solution to remove the mask as well as the winding plating and the BSG on the front surface and the back surface. That is, compared with a related technology, an etching procedure is avoided during the removal of the winding plating, and only hydrofluoric acid soaking is required, thus saving procedure flow and then reducing a production cost of the N-type monocrystalline silicon double-sided solar cell. The hydrofluoric acid aqueous solution has a mass concentration of 5-50%, optionally 20-40%.

Optionally, the winding plating and the BSG on the front surface and the back surface and the mask 13 are removed in the hydrofluoric acid aqueous solution, and then, cleaning is performed, such that the removal effect is better.

Optionally, the step of depositing a passivation antireflection layer on a surface of the front-surface doped emitter junction layer 21 includes: depositing an aluminum oxide layer 22 and a front-surface silicon nitride layer 23 on the surface of the front-surface doped emitter junction layer 21 in sequence, a thickness of the aluminum oxide layer 22 being 1-3 nm, and a thickness of the silicon nitride layer being 75-82 nm; the aluminum oxide layer 22 can effectively reduce the winding plating to realize efficient passivation of the N-type solar cell by aluminum oxide, and effectively improve a passivation effect in conjunction with the silicon nitride layer.

Optionally, the step of depositing a passivation antireflection layer on the surface of the back surface field 11 includes: depositing a back-surface silicon nitride layer 14 on the surface of the back surface field 11, the back-surface silicon nitride layer 14 having a film thickness of 80-85 nm, such as 80 nm, 82 nm, 83 nm, 84 nm, 85 nm, or the like.

S6: preparing a front surface electrode 24 and the back surface electrode 15.

Materials of the front surface electrode 24 and the back surface electrode 15 include, but are not limited to, one or more of silver, aluminum, copper, nickel, titanium, tin, lead, cadmium, gold and zinc, or alloys thereof.

Optionally, the step of preparing a front surface electrode 24 and the back surface electrode 15 includes: printing silver paste grid lines on the front surface and the back surface and then sintering.

The present disclosure further provides an N-type monocrystalline silicon double-sided solar cell which is prepared using the above preparation method.

A first textured structure has a platform-shaped textured morphology, the first textured structure includes a plurality of platform structures arranged in an array, a height of the platform structure is 0.3-0.5 μm, each platform structure has a lower plane connected with N-type monocrystalline silicon and an upper plane opposite to the lower plane, a size of the lower plane is greater than that of the upper plane, a width of the lower surface of the platform structure is 10-15 μm, and reflectivity of the first textured structure is 25-35%.

The N-type monocrystalline silicon double-sided solar cell and the preparation method thereof according to the present disclosure are further described in detail below with reference to examples.

Example 1

1. 995 pieces of N-type monocrystalline silicon with a thickness of 180±5 μm and a size of 210 mm×210 mm were obtained.

2. Double-sided texturing: a surface of each piece of N-type monocrystalline silicon was cleaned and subjected to alkali texturing, a size and a height of a grown pyramid were controlled using an alkali texturing additive purchased from Shichuang (hereinafter referred to as a texturing Shichuang additive), and temperature-controlled acid texturing was performed in a texturing tank to obtain N-type monocrystalline silicon with a front surface and a back surface having a platform-shaped textured morphology respectively as sample 1, the platform-shaped textured morphology including a plurality of platform structures arranged in an array, each platform structure having a lower plane connected with the N-type monocrystalline silicon and an upper plane opposite to the lower plane, and a size of the lower plane being greater than that of the upper plane.

The alkali texturing step included: adopting a potassium hydroxide aqueous solution with a mass concentration of 2%, a temperature being 70° C., a texturing time being 180 s, and the texturing additive being a Shichuang additive which was mixed with the potassium hydroxide aqueous solution according to a mass ratio of 9:10.

Temperature-controlled acid texturing ratio: texturing was performed at 10° C. for 80 s using an acid solution consisting of a hydrofluoric acid aqueous solution and a nitric acid aqueous solution having a volume ratio of 1:1, the hydrofluoric acid aqueous solution having a mass concentration of 30% and the nitric acid aqueous solution having a mass concentration of 30%.

After tests, the lower surface of the platform structure had a width of 14 μm, a height of 0.4 μm, and reflectivity (the whole wave band of 300-1200 nm) of 27%.

3. Back-surface phosphorus diffusion doping: back-surface phosphorus diffusion doping was performed on the sample 1 using a low-pressure high-temperature diffusion process, and a back surface field and PSG were finally generated on the back surface of the cell as sample 2. The low-pressure diffusion process had pressure of 75 mPa, a phosphorus-source flow rate of 1000 sccm, a post-oxidation time of 5 min, and a junction push temperature of 850° C. Sheet resistance after diffusion was 160 Ω/sq.

4. Laser SE: laser pulse heating was performed, by laser, on a position of a back surface of the sample 2 to be provided with a back surface electrode, so as to diffuse phosphorus atoms to a silicon substrate to form a local heavily doped region as sample 3, a tested sheet resistance of the local heavily doped region being 80 Ω/sq.

5. Removal of PSG and formation of mask on back surface: the PSG on a front surface and a back surface of the sample 3 was removed by cleaning of an HF aqueous solution, and then, a silicon nitride mask was formed on the back surface using plate PECVD as sample 4.

The silicon nitride mask has a thickness of 21 nm.

6. Alkali texturing: the sample 4 was cleaned using an HF aqueous solution with a mass concentration of 35%, so as to remove a small oxide layer generated on the front surface of the N-type monocrystalline silicon in the step 5 in the plate-type PECVD high-temperature process, and then, alkali texturing was performed on the cleaned sample 4, weight loss in the alkali texturing step being controlled to be 0.255 g/piece. Then, cleaning was performed using an HF aqueous solution with a mass concentration of 21%, and cleaning was performed using an HCL aqueous solution with a mass concentration of 23% to obtain sample 5, with the front surface of the N-type monocrystalline silicon of the sample 5 having a pyramid-shaped textured morphology with reflectivity of 9.7%.

The alkali texturing step included: performing texturing at 70° C. for 180 s using a strong alkali aqueous solution containing a texturing Shichuang additive and having a KOH strong alkali mass concentration of 2%.

7. Removal of BSG after boron diffusion: after boron diffusion doping of the front surface of the N-type monocrystalline silicon of the sample 5, the sample was placed into a BSG removal apparatus, and when sheet resistance of a front-surface boron diffusion layer was 77 Ω/sq, an HF aqueous solution with a mass concentration of 24% was used to remove the BSG and a silicon nitride mask, and cleaning was performed to obtain sample 6.

8. ALD: a layer of aluminum oxide was grown on a front surface of the sample 6, and when a thickness thereof was tested to be 2.5 nm, sample 7 was obtained.

9. Film coating procedure: a layer of silicon nitride was grown on each of a front surface and a back surface of the sample 7, the silicon nitride film on the front surface having a thickness of 80 nm and the silicon nitride film on the back surface having a thickness of 82 nm.

10. Silver paste grid lines on the front surface and the back surface were printed and then sintered.

Finally, 985 finished products were obtained, a performance test was performed on the 985 N-type monocrystalline silicon double-sided solar cells obtained in example 1, and results of average performance parameters of each N-type monocrystalline silicon double-sided solar cell are shown in table 1.

TABLE 1

Test results

| Total number | Eta/% | Uoc/V | Isc/A | FF/% | Rs/Ω | Rsh/Ω | Irev 2/A |
|---|---|---|---|---|---|---|---|
| 985 | 23.244 | 0.6855 | 10.185 | 81.332 | 0.004925 | 8265.3 | 0.023 |

Example 2

1. 1024 pieces of N-type monocrystalline silicon with a thickness of 180±5 μm and a size of 210 mm×210 mm were obtained.

2. Double-sided texturing: a surface of each piece of N-type monocrystalline silicon was cleaned and subjected to alkali texturing, a size and a height of a grown pyramid were controlled using a Shichuang texturing additive, and temperature-controlled acid texturing was performed in a texturing tank to obtain N-type monocrystalline silicon with a front surface and a back surface having a platform-shaped textured morphology respectively as sample 1, the platform-shaped textured morphology including a plurality of platform structures arranged in an array, each platform structure having a lower plane connected with the N-type monocrystalline silicon and an upper plane opposite to the lower plane, and a size of the lower plane being greater than that of the upper plane.

The alkali texturing step included: adopting a potassium hydroxide aqueous solution with a mass concentration of 3%, a temperature being 72° C., a texturing time being 170 s, and the texturing additive being a Shichuang additive which was mixed with the potassium hydroxide aqueous solution according to a mass ratio of 7:19.

Temperature-controlled acid texturing ratio: texturing was performed at 10° C. for 82 s using an acid solution consisting of a hydrofluoric acid aqueous solution and a nitric acid aqueous solution having a volume ratio of 1:1, the hydrofluoric acid aqueous solution having a mass concentration of 30% and the nitric acid aqueous solution having a mass concentration of 30%.

After tests, the lower surface of the platform structure of Example 2 had a width of 14.5 μm, a height of 0.32 μm, and reflectivity (the whole wave band of 300-1200 nm) of 33%.

3. Back-surface phosphorus diffusion doping: back-surface phosphorus diffusion doping was performed on the sample 1 using a low-pressure diffusion process, and a back surface field and PSG were finally generated on the back surface of the cell as sample 2. The low-pressure diffusion process had pressure of 75 mPa, a phosphorus-source flow rate of 1000 sccm, a post-oxidation time of 5 min, and a junction push temperature of 850° C. Sheet resistance after diffusion was 160 Ω/sq.

4. Laser SE: laser pulse heating was performed, by laser, on a position of a back surface of the sample 2 to be provided with a back surface electrode, so as to diffuse phosphorus atoms to a silicon substrate to form a local heavily doped region as sample 3, test sheet resistance of the heavily doped region being 80 Ω/sq.

5. Removal of PSG and formation of mask on back surface: the PSG on a front surface and a back surface of the sample 3 was removed by cleaning of an HF aqueous solution, and then, a silicon nitride mask was formed on the back surface using plate PECVD as sample 4.

The silicon nitride mask has a thickness of 21 nm.

6. Alkali texturing: the sample 4 was cleaned using an HF aqueous solution with a mass concentration of 35%, so as to remove a small oxide layer generated on the front surface of the N-type monocrystalline silicon in the step 5 in the plate-type PECVD high-temperature process, and then, alkali texturing was performed on the cleaned sample 4, weight loss in the alkali texturing step being controlled to be 0.255 g/piece. Then, cleaning was performed using an HF aqueous solution with a mass concentration of 21%, and cleaning was performed using an HCL aqueous solution with a mass concentration of 23% to obtain sample 5, the front surface of the N-type monocrystalline silicon of the sample 5 having a pyramid-shaped textured morphology with reflectivity of 9.7%.

The alkali texturing step included: performing texturing at 70° C. for 180 s using a strong alkali aqueous solution containing a Shichuang texturing additive and having a KOH strong alkali mass concentration of 2%.

7. Removal of BSG after boron diffusion: after boron diffusion doping of the front surface of the N-type monocrystalline silicon of the sample 5, the sample was placed into a BSG removal apparatus, and when sheet resistance of a front-surface boron diffusion layer was 77 Ω/sq, an HF aqueous solution with a mass concentration of 24% was used to remove the BSG and a silicon nitride mask, and cleaning was performed to obtain sample 6.

8. ALD: a layer of aluminum oxide was grown on a front surface of the sample 6, and when a thickness thereof was tested to be 2 nm, sample 7 was obtained.

9. Film coating procedure: a layer of silicon nitride was grown on each of a front surface and a back surface of the sample 7, the silicon nitride film on the front surface having a thickness of 80.1 nm and the silicon nitride film on the back surface having a thickness of 82.4 nm.

10. Silver paste grid lines on the front surface and the back surface were printed and then sintered.

Finally, 1011 finished products were obtained, a performance test was performed on the 1011 N-type monocrystalline silicon double-sided solar cells obtained in example 2 using a testing method of Example 1, and results of average performance parameters of each N-type monocrystalline silicon double-sided solar cell are shown in table 2.

TABLE 2

| Test results | | | | | | | |
|---|---|---|---|---|---|---|---|
| Total number | Eta/% | Uoc/V | Isc/A | FF/% | Rs/Ω | Rsh/Ω | Irev 2/A |
| 1011 | 23.252 | 0.6826 | 10.179 | 81.765 | 0.0048 | 5382.7 | 0.032 |

Comparative Example 1

An N-type monocrystalline silicon double-sided solar cell was prepared, which specifically included the following steps.

1. 1055 pieces of N-type monocrystalline silicon with a thickness of 180±5 μm and a size of 210 mm×210 mm were obtained.

2. Double-sided texturing: a surface of each piece of N-type monocrystalline silicon was cleaned and subjected to alkali texturing, and a size and a height of a grown pyramid were controlled using a texturing Shichuang additive, the alkali texturing step including: adopting a potassium hydroxide aqueous solution with a mass concentration of 2%, a temperature being 70° C., a texturing time being 180 s, and the texturing additive being a Shichuang additive which was mixed with the potassium hydroxide aqueous solution according to a mass ratio of 9:10.

3. After a front surface of the N-type monocrystalline silicon was subjected to boron diffusion doping, sheet resistance of the front-surface boron diffusion layer was 77 Ω/sq.

4. Chain-type pickling was performed on a back surface, and BSG was removed by using an HF aqueous solution with a mass concentration of 24% for cleaning.

5. A step-structure textured surface was formed on the back surface, the step textured surface was prepared at 80° C. for 700 s using an alkaline solution containing tetramethyl ammonium hydroxide and isopropanol, and meanwhile, a boron doped layer on the back surface was removed.

6. Back-surface phosphorus diffusion was performed, a low-pressure diffusion process having pressure of 75 mPa, a phosphorus-source flow rate of 1000 sccm, a post-oxidation time of 5 min, and a junction push temperature of 850° C. Sheet resistance after diffusion was 80 Ω/sq.

7. Back-surface ALD: a layer of aluminum oxide was grown on a front surface of the sample 6, and a thickness thereof was tested to be 2.3 nm.

8. Film coating procedure: a layer of silicon nitride was grown on each of the front surface and the back surface, the silicon nitride film on the front surface having a thickness of 80.1 nm and the silicon nitride film on the back surface having a thickness of 82.7 nm.

9. Silver paste grid lines on the front surface and the back surface were printed and then sintered.

Finally, 1046 finished products were obtained, a performance test was performed on the 1046 N-type monocrystalline silicon double-sided solar cells obtained in Comparative Example 1 using a testing method of Example 1, and results of average performance parameters of each N-type monocrystalline silicon double-sided solar cell are shown in table 3.

TABLE 3

| Test data | | | | | | | |
|---|---|---|---|---|---|---|---|
| Number | Eta/% | Uoc/V | Isc/A | FF/% | Rs/Ω | Rsh/Ω | Irev 2/A |
| 1046 | 23.124 | 0.6830 | 10.154 | 81.466 | 0.0044 | 238.7 | 0.043 |

As can be seen from comparison of data in tables 1 and 3, under a condition that other parameters are not much different, the parallel resistance Rsh of Comparative Example 1 is significantly lower than that of Examples 1 and 2, which illustrates that the parallel failure problem caused by incomplete etching can be avoided due to a specific preparation process and the existence of the mask in the method according to the present disclosure.

In conclusion, the preparation method of an N-type monocrystalline silicon double-sided solar cell according to the present disclosure has simple manufacturing steps, removes the acid polishing or alkali polishing etching procedure, can effectively reduce the production cost, and avoids the problem of parallel failure caused by incomplete etching; the introduction of the first textured structure on the back surface can reduce the reflectivity of the back surface, and can ensure that the back surface has certain roughness and can be in better contact with the back surface electrode, thus improving the quantum conversion efficiency of the back surface of the N-type monocrystalline silicon double-sided solar cell.

The above is only a specific embodiment of the present disclosure and is not intended to limit the present disclosure, and various modifications and changes may be made to the present disclosure by those skilled in the art. Any modification, equivalent replacement, or improvement made within the spirit and principle of the present disclosure shall be included in the protection scope of the present disclosure.

INDUSTRIAL APPLICABILITY

The present disclosure provides the N-type monocrystalline silicon double-sided solar cell and the preparation method thereof, and pertains to the field of solar cells. The preparation method includes the following steps: S1: performing the double-sided texturing to obtain the N-type monocrystalline silicon with the front surface and the back surface having the first textured structures respectively; S2: performing the back-surface phosphorus diffusion doping to form the back surface field; S3: removing the winding plating and the PSG on the front surface and the back surface, forming the mask for protecting the first textured structure of the back surface on the surface of the back surface field, and manufacturing the second textured structure on the front surface of the N-type monocrystalline silicon; S4: performing the front-surface boron diffusion doping to form the front-surface doped emitter junction layer; S5: after the removal of the mask as well as the winding plating and the BSG on the front surface and the back surface, depositing the passivation antireflection layer on the surface of the front-surface doped emitter junction layer, and depositing the passivation layer on the surface of the back surface field; and S6: preparing the front surface electrode and the back surface electrode. The preparation method has simple manufacturing steps, effectively reduces the production cost, and improves the quantum conversion efficiency of the manufactured N-type monocrystalline silicon double-sided solar cell.

Furthermore, it may be understood that the N-type monocrystalline silicon double-sided solar cell and the preparation method thereof according to the present disclosure are reproducible and may be used in various industrial applications. For example, the N-type monocrystalline silicon double-sided solar cell and the preparation method thereof according to the present disclosure may be used to the field of solar cells.

What is claimed is:

1. A preparation method of an N-type monocrystalline silicon double-sided solar cell, comprising following steps:
    S1: performing double-sided texturing to obtain N-type monocrystalline silicon with a front surface and a back surface having a first textured structure respectively;
    S2: performing back-surface phosphorus diffusion doping to form a back surface field;
    S3: removing winding plating and PSG on the front surface and the back surface, forming a mask for protecting the first textured structure of the back surface on a surface of the back surface field, and manufacturing a second textured structure on the front surface of the N-type monocrystalline silicon, wherein the second textured structure has a pyramid-shaped textured morphology, wherein the material of the mask comprises silicon nitride which does not react with a strong alkali solution; and the step of manufacturing a second textured structure on the front surface of the N-type monocrystalline silicon comprises: soaking in the strong alkali aqueous solution;
    S4: performing front-surface boron diffusion doping to form a front-surface doped emitter junction layer;
    S5: after removal of the mask as well as the winding plating and BSG on the front surface and the back surface, depositing a passivation antireflection layer on a surface of the front-surface doped emitter junction layer, and depositing a passivation layer on the surface of the back surface field; and
    S6: preparing a front surface electrode and a back surface electrode;
    wherein step S5 comprises: cleaning using a hydrofluoric acid aqueous solution to remove the mask as well as the winding plating and BSG on the front surface and the back surface.

2. The preparation method according to claim 1, wherein in step S1, the first textured structure has a platform-shaped textured morphology, the first textured structure comprises a plurality of platform structures arranged in an array, each platform structure has a lower plane connected to the N-type monocrystalline silicon and an upper plane opposite to the lower plane, and a size of the lower plane is greater than that of the upper plane.

3. The preparation method according to claim 2, wherein a height of each platform structure is 0.3-0.5 µm, a width of a lower surface of each platform structure is 10-15 µm, and reflectivity of the platform-shaped textured morphology is 25-35%.

4. The preparation method according to claim 1, wherein in step S1, the step of performing double-sided texturing comprises: firstly performing alkali texturing using the strong alkali aqueous solution to obtain N-type monocrystalline silicon with a front surface and a back surface having a pyramid textured morphology respectively, and then performing acid texturing on the N-type monocrystalline silicon with the front surface and the back surface having the pyramid textured morphology respectively, so as to obtain the N-type monocrystalline silicon with the front surface and the back surface having the first textured structure respectively.

5. The preparation method according to claim 4, wherein the step of performing acid texturing comprises: soaking in an acid solution consisting of a hydrofluoric acid aqueous solution and a nitric acid aqueous solution having a volume ratio of 0.9-1.1:0.9-1.1, and performing texturing for 20-100 s at 8-15° C., the hydrofluoric acid aqueous solution having a mass concentration of 20-40% and the nitric acid aqueous solution having a mass concentration of 20-40%.

6. The preparation method according to claim 4, wherein the step of performing alkali texturing comprises: soaking the strong alkali aqueous solution with a mass concentration of 1.5-3%, and performing texturing for 50-200 s at 65-75° C.

7. The preparation method according to claim 5, wherein the step of performing alkali texturing comprises: soaking in the strong alkali aqueous solution with a mass concentration of 1.5-3%, and performing texturing for 50-200 s at 65-75° C.

8. The preparation method according to claim 1, wherein in step S3, the step of manufacturing a second textured structure on the front surface of the N-type monocrystalline silicon comprises: soaking in the strong alkali aqueous solution with a volume concentration of 1.5-3%, performing texturing for 50-200 s at 65-75° C., and cleaning a surface using a hydrofluoric acid aqueous solution and a hydrochloric acid aqueous solution sequentially.

9. The preparation method according to claim 8, wherein a material of the mask comprises silicon nitride, and the mask has a thickness of 15-25 nm.

10. The preparation method according to claim 8, wherein cleaning a surface using a hydrofluoric acid aqueous solution and a hydrochloric acid aqueous solution sequentially comprises using the hydrofluoric acid aqueous solution to remove the winding plating and the PSG on the front surface and the back surface.

11. The preparation method according to claim 9, wherein step S5 comprises removing the mask, and wherein removing the mask as well as the winding plating and BSG on the front surface and the back surface comprises cleaning using a hydrofluoric acid aqueous solution.

12. The preparation method according to claim 9, wherein step S3 comprises: cleaning using a hydrofluoric acid aqueous solution to remove the winding plating and the PSG on the front surface and the back surface.

13. The preparation method according to claim 1, wherein after the back-surface phosphorus diffusion doping is performed to form the back surface field, step S2 further comprises: performing, using laser, local heavy doping on a position of the back surface of the N-type monocrystalline silicon to be provided with the back surface electrode.

14. The preparation method according to claim 1, wherein the back-surface phosphorus diffusion doping is performed using a low-pressure diffusion process, and the low-pressure diffusion process has low-pressure diffusion pressure of 50-100 mPa, a phosphorus-source flow rate of 800-1200 sccm, a post-oxidation time of 3-8 min, and a junction push temperature of 840-860° C.

15. The preparation method according to claim 1, wherein the step of depositing a passivation antireflection layer on a surface of the front-surface doped emitter junction layer comprises: depositing an aluminum oxide layer and a front-surface silicon nitride layer on the surface of the front-surface doped emitter junction layer in sequence, wherein a thickness of the aluminum oxide layer is 1-3 nm, and a thickness of the silicon nitride layer is 75-82 nm.

16. The preparation method according to claim 1, wherein the step of depositing a passivation antireflection layer on a surface of the back surface field comprises: depositing a back-surface silicon nitride layer on the surface of the back surface field, the back-surface silicon nitride layer 14 having a film thickness of 80-85 nm.

* * * * *